(12) United States Patent
O'Gorman et al.

(10) Patent No.: US 6,804,272 B2
(45) Date of Patent: Oct. 12, 2004

(54) SELF-PULSATING LASER DIODE AND A METHOD FOR CAUSING A LASER DIODE TO OUTPUT LIGHT PULSES

(75) Inventors: James Christopher O'Gorman, Dublin (IE); Paul McEvoy, Hertfordshire (GB); Stephen Anthony Lynch, Louth (IE); Pascal Michel Landais, Dublin (IE)

(73) Assignee: The Provost, Fellows and Scholars of the College of the Holy and Undivided Trinity of Queen Elizabeth Near Dublin, Dublin (IE)

(*) Notice: Subject to any disclaimer, the term of this patent is extended or adjusted under 35 U.S.C. 154(b) by 0 days.

(21) Appl. No.: 10/257,680

(22) PCT Filed: Apr. 12, 2001

(86) PCT No.: PCT/IE01/00050
§ 371 (c)(1),
(2), (4) Date: Mar. 14, 2003

(87) PCT Pub. No.: WO01/78205
PCT Pub. Date: Oct. 18, 2001

(65) Prior Publication Data
US 2003/0185262 A1 Oct. 2, 2003

(30) Foreign Application Priority Data
Apr. 12, 2000 (IE) .......................................... S2000/0287

(51) Int. Cl.[7] .............................................. H01S 3/13
(52) U.S. Cl. ............................ 372/30; 372/43; 372/44; 372/45; 372/46; 372/47; 372/48; 372/49; 372/50
(58) Field of Search ................................ 372/30, 43–50

(56) References Cited

U.S. PATENT DOCUMENTS

| | | |
|---|---|---|
| 5,416,790 A | 5/1995 | Yodoshi et al. |
| 5,581,570 A | 12/1996 | Yodoshi et al. |
| 5,610,096 A | 3/1997 | Yodoshi et al. |
| 5,850,411 A | 12/1998 | Major, Jr. et al. |
| 5,966,397 A | 10/1999 | Hirata |

FOREIGN PATENT DOCUMENTS

| | | |
|---|---|---|
| EP | 0 827 242 A | 3/1998 |
| JP | 61 101089 A | 5/1986 |

OTHER PUBLICATIONS

S. Lynch et al.;: "Effect of Temperature on Self–pulsation in narrow stripe, gain–guided, compact disk laser diodes" Technical digest. Summaries of Papers presented at the Conference on Lasers and Electro–optics. Conference Edition. 1998 Technical Digest Series, vol. 6 (IEEE CAT No. 98CH36178), Technical Digest Summaries of Papers presented at the conference on Lase, pp. 239–240, XP00176808, 1998, Washington, DC, USA, Opt., Soc. America, USA ISBN: 1–55752–339–0.

T. Takayama et al.: "Low Operating Current Self–Sustained Pulsation Gaalas Laser Diodes with a Real Refractive Indesx Guided Structure" Applied Physics Letters, American Institute of Physics, New Yor,k, US, vol. 65, No. 10, Sep. 5, 1994, pp. 1211–1212, XP000464606, ISSN: 0003–6951.

"Self–pulsating Lasers with Quantum well saturable Absorber", R.C.P. Hoskins et al. ; Appl. Phys. Lett. 67 (10), Sep. 4, 1995, American Institute of Physics.

"Models of Static and Dynamic Behaviour of Stripe Geometry Lasers", Jens Buus, IEEE Journal of Quantum Electronics, vol. QE–19, No. 6, Jun. 1983.

"Stable Operation of Self–Sustained Pulsation in 650–nm–band AlGaLnP Visible Lasers with Highly Doped Saturable Absorbing Layer"Isao Kudoguchi et al., Appl. Phys. Lett 68 (25), Jun. 17, 1996, American Institute of Physics.

*Primary Examiner*—Don Wong
*Assistant Examiner*—Delma R. Flores-Ruiz
(74) *Attorney, Agent, or Firm*—Sughrue Mion, PLLC

(57) ABSTRACT

A semiconductor self-pulsating laser diode (1) comprises a wave guiding layer (2) sandwiched between lower and upper cladding layers (4, 5). A current blocking layer (8) defining a slot (10) through which pumping current is directed through the laser diode between upper and lower contact plates (5, 6) defines an active wave guiding region (15). The current blocking layer (8) is shaped by the formation of longitudinally extending recesses (12) for defining the active wave guiding region (15) such that a central pulse light generating region (17) is formed surrounded by an outer light propagating region (18). As the laser diode is continuously pumped, an effective step change in refractive index between the wave guiding layer (2) and the outer light propagating region (18) is formed, and the carrier density and refractive index profiles across the active wave guiding region (15) vary as each light pulse cycle progresses. Initially, the carrier density in the central pulse light generating region 17 rises relative to the carrier density in the light propagating region 18 until the difference between the refractive index of the pulse light generating region 17 and the refractive index of the light propagating region 18 is at its greatest, and the carrier density of the pulse light generating region 17 reaches its lasing threshold value. At this stage lasing commences in the active wave guiding region 15. Lasing in the pulse light generating region 17 progressively reduces the carrier density therein, which in turn progressively reduces the relative difference between the refractive index of the pulse light generating region 17 and the light propagating region 18 until the refractive index of the pulse light generating region 17 approaches the refractive index of the light propagating region 18, thereby increasing guiding of lasing light into the pulse light generating region 17 for emission of the light pulse therefrom. At that stage the carrier density of the active wave guiding region 15 falls below its lasing threshold value, thus extinguishing the lasing light, and the next light pulse cycle commences.

20 Claims, 13 Drawing Sheets

SELF-PULSATING LASER DIODE AND A METHOD FOR CAUSING A LASER DIODE TO OUTPUT LIGHT PULSES

This is a National stage entry under 35 U.S.C. §371 of Application No. PCT/IE01/00050 filed Apr. 12, 2001; the above noted prior applications are all hereby incorporated by reference.

BACKGROUND OF THE INVENTION

The present invention relates to a semiconductor self-pulsating laser diode and to a method for causing a semiconductor laser diode to output a plurality of light pulses in sequential light pulse cycles.

Semiconductor self-pulsating laser diodes are known. Commonly, such self-pulsating laser diodes output pulsed light of wavelengths of approximately 800 nm. Such laser diodes are commonly used for reading data from a disc, for example, a CD disc. It is widely believed that the self-pulsating behaviour of semiconductor laser diodes results from the provision of saturable absorber regions positioned adjacent an active wave guiding region of the laser diode such that light propagating in the active wave guiding region overlaps the saturable absorber region. The saturable absorber regions are formed by materials which have an intensity dependent absorption coefficient. As the active region is excited, the saturable absorber region absorbs light generated in the active wave guiding region, which in turn generates charge carriers in the saturable absorber region. The build-up of charge carriers in the saturable absorber region reduces the absorption coefficient of the material of the saturable absorber region, and thus reduces its capacity to absorb additional photons at that wavelength. Further excitation of the active wave guiding region causes the saturable absorber region to saturate, from which the term "saturable absorber" is derived. At saturation the absorber material of the saturable absorber region has a decreased loss, and thus the lasing condition for the laser diode is met and lasing light is emitted from the laser diode. The resulting emission of light from the laser diode depletes the charge carriers in the active region until lasing stops. Charge carriers generated in the saturable absorber region diffuse out of this region and return the absorber material to its original high absorption state, aiding quenching of the lasing emission and commencing the next cycle. In this manner a series of pulses of light are emitted from the laser diode in sequential cycles at a repetition rate which is predominantly determined by the carrier dynamics of the laser diode.

Many such self-pulsating laser diodes are described in the patent literature. U.S. Pat. Nos. 5,416,790 and 5,610,096 (both assigned to Sanyo Electric Co. Ltd.) disclose AlGaAs semiconductor lasers comprising a saturable optical absorbing layer having a band gap energy substantially equal to the energy corresponding to the lasing wavelength. U.S. Pat. No. 5,581,570 (assigned to Mitsubishi Denki Kabushiki Kaishi) discloses a semiconductor laser device comprising a saturable absorption region the function of which is the production of enhanced and pulsation oscillation at high power light output. In R. C. P. Hoskins, T. G. van de Roer, C. J. van der Poel, H. P. M. Ambrosius: *Applied Physics Letters* 67, 1343, (1995), Hoskins et al teach that self-pulsation can be induced in broad area AlGaAs diode lasers by including an extra GaAs layer functioning as a saturable absorber.

In J. Buus: *IEEE Journal of Quantum Electronics* 19,953, (1983), Buus has suggested that self-focusing, caused by the dependence of the refractive index on the carrier density, may contribute to self-pulsation in GaAs/GaAlAs devices which have no built-in wave guide. Buus discusses devices with relatively wide lasing stripes defined by the current injection regions which guide light by virtue of confining the gain to a stripe impressed along the light propagation axis of the laser. Any index guiding effects that may occur are fortuitous or incidental due to optically, photoelastically and thermally induced phenomena.

Considerable efforts have been made to develop a self-pulsating laser which would emit light at wavelengths shorter than 800 nm in order to satisfy demand for higher storage capacity capabilities. Such lasers are made from materials well-known to those skilled in the art and comprise suitable combinations of elements such as Indium, Gallium, Arsenic, Phosphorous, Aluminium, Nitrogen Cadmium, Zinc, Sulphur and Selenium for short wavelength (less than 700 nm) operation. Additionally, telecommunications applications could utilise robust self-pulsating laser devices made from these and other well-known elements which emit around longer wavelengths such as 0.98 $\mu$m, 1.3 $\mu$m or 1.5 $\mu$m.

Applying the saturable absorber approach to materials which emit light at 650 nm, Kidoguchi et al [I. Kidoguchi, H. adachi, T. Fukuhisa, M. Mannoh, A. Takamori: *Applied Physics Letters* 68, 3543, (1996)] teach that self-pulsating AlGaInP lasers emitting light at a wavelength in the order of 650 nm may be fabricated by adopting a structure which has a highly doped saturable absorbing layer. Again using the saturable absorber approach U.S. Pat. No. 5,850,411 (assigned to SDL Inc.) discloses an AlGaInP/GaAs laser diode in which the active region is made up of quantum wells that are less than 5 nm thick such that quantum confinement of the charge carriers becomes significant. This facilitates operation with light emission of wavelength in the order of 620–650 nm. It is taught therein that self-pulsation may be obtained by the inclusion into such structures of a saturable absorber layer proximate to the active region.

Other devices emitting at 650 nm based on the incorporation of saturable absorbers are known. However, 650 nm lasers incorporating saturable absorbers have a number of disadvantages. The major disadvantage is the increased threshold current required to achieve lasing and to realise self-pulsation. This increase in threshold current arises from the increased loss introduced into the laser cavity by inclusion of the saturable absorption layer. An increase in the threshold current leads to an undesirable increase in heating in the device, which reduces the gain available in the laser due to its decrease with increasing temperature. Furthermore, in quantum well devices designed to emit at around 650 nm, or 1.3 to 1.5 $\mu$m for that matter, an increase in the threshold current required to operate the device causes an increase in leakage of charge carriers over the heterobarriers of the structure. This in turn has a detrimental impact on the temperature and self-pulsation properties of the device.

There is therefore a need for a self-pulsating laser diode which overcomes the disadvantages of known self-pulsating laser diodes, and there is also a need for a method for causing a laser diode to output light pulses.

The present invention is directed towards providing such a self-pulsating laser and such a method.

SUMMARY OF THE INVENTION

According to the invention there is provided a semiconductor self-pulsating laser diode comprising a wave guiding layer, wherein the laser diode is configured so that when the laser diode is pumped, (a) an active wave guiding region is defined in the wave guiding layer, the active wave guiding region comprising a pulsed light generating region in which pulsed light is guided during respective sequential light pulse cycles, the pulse light generating region extending longitudinally in the direction of pulsed light propagation, and an adjacent light propagating region in which light is propagated, and (b) during each light pulse cycle the carrier density profile across the active wave guiding region progressively varies such that initially the carrier density in the pulse light generating region rises relative to the carrier density in the light propagating region until the difference between the refractive index of the pulse light generating region and the refractive index of the light propagating region is at its greatest, and the carrier density of the pulse light generating region reaches its lasing threshold value, thus causing lasing to commence in the active wave guiding region, and the lasing in the pulse light generating region progressively reduces the carrier density therein, which in turn progressively reduces the relative difference between the refractive index of the pulse light generating region and the light propagating region until the refractive index of the pulse light generating region approaches the refractive index of the light propagating region, thereby increasing guiding of the lasing light into the pulse light generation region for emission of the light pulse therefrom, at which stage the carrier density of the active wave guiding region falls below its lasing threshold value extinguishing the lasing light, and the next light pulse cycle commences.

In one embodiment of the invention the laser diode is configured so that the progressive reduction in the carrier density of the pulse light generating region after lasing commences in the active wave guiding region is further facilitated by photopumping and charge carrier diffusion from the pulse light generating region to the light propagating region.

Preferably, the laser diode is configured so that during pumping of the laser the refractive index of the light propagating region is higher than the refractive index of the adjacent wave guiding layer. Advantageously, the amount by which the refractive index of the pulse light generating region is less than the refractive index of the light propagating region at the beginning of each light pulse cycle is substantially similar to the amount by which the refractive index of the light propagating region is higher than the refractive index of the adjacent wave guiding layer. Preferably, the transition of the refractive indices between the higher refractive index of the light propagating region and the lower refractive index of the wave guiding layer during pumping of the laser diode is substantially a step transition.

In one embodiment of the invention the light propagating region is located in the wave guiding layer on respective opposite sides of the pulse light generating region, and extends parallel to the pulse light generating region. Preferably, the light propagating region surrounds the pulse light generating region.

In another embodiment of the invention the laser diode is configured by providing a current blocking layer in the laser diode, the current blocking layer defining a current passageway for the passage of a pumping current therethrough and defining the active wave guiding region in the wave guiding layer. Preferably, the current blocking layer extends parallel to the wave guiding layer and defines an elongated slot extending parallel to the direction of light propagation in the pulse light generating region for defining the current passageway.

In one embodiment of the invention the wave guiding layer is sandwiched between a pair of cladding layers. Preferably, the respective cladding layers extend parallel to the wave guiding layer.

In another embodiment of the invention the current blocking layer is located in one of the cladding layers.

In a further embodiment of the invention the current blocking layer is shaped so that the pumping current defines the active wave guiding region. Preferably, the current blocking layer is shaped to define the pulse light generating region and the light propagating region. Advantageously, the current blocking layer is shaped adjacent the current passageway for defining the active wave guiding region.

In one embodiment of the invention elongated recesses for defining the active wave guiding region are formed on respective opposite edges of the current blocking layer which define the current passageway. Preferably, the recesses formed in the respective opposite edges of the current blocking layer defining the current passageway are formed in the respective edges and a major surface of the current blocking layer which is closest to the wave guiding layer.

In another embodiment of the invention a pair of parallel spaced apart barrier means are located in the wave guiding layer extending parallel to the direction of light propagation in the pulse light generating region, the barrier means defining the active wave guiding region therebetween in a lateral direction perpendicular to the direction of light propagation in the pulse light generating region. Preferably, the respective barrier means co-operate with the current blocking layer for defining the active wave guiding region.

In another embodiment of the invention the laser diode is configured by the provision of a pair of parallel spaced apart channels located in one of the cladding layers adjacent the pulse light generating region, the respective channels extending parallel to the direction of light propagation in the pulse light generating region, and containing material of refractive index higher than the material of the cladding layer for defining the active wave guiding region. Preferably, the respective channels are located in the cladding layer opposite the cladding layer in which the current blocking layer is provided. Advantageously, the refractive index of the material contained in the respective channels is similar to that of the wave guiding layer. Ideally, the respective channels co-operate with the current blocking layer for defining the active wave guiding region.

In one embodiment of the invention the material of the wave guiding layer is selected for outputting light pulses of wavelength up to 1,700 nm.

In another embodiment of the invention the material of the wave guiding layer is selected for outputting light pulses of wavelength up to 1,550 nm.

In a further embodiment of the invention the material of the wave guiding layer is selected for outputting light pulses of wavelength up to 1,300 nm.

In a still further embodiment of the invention the material of the wave guiding layer is selected for outputting light pulses of wavelength up to 980 nm.

In a still further embodiment of the invention the material of the wave guiding layer is selected for outputting light pulses of wavelength up to 700 nm.

In a still further embodiment of the invention the material of the wave guiding layer is selected for outputting light pulses of wavelength up to 650 nm.

In a still further embodiment of the invention the material of the wave guiding layer is selected for outputting light pulses of wavelength up to 600 nm.

Additionally, the invention provides a method for causing a laser diode to output a plurality of light pulses in respective sequential light pulse cycles, the laser diode comprising a wave guiding layer, and the method comprising the steps of configuring the laser diode so that when the laser diode is pumped, (a) an active wave guiding region is defined in the wave guiding layer, the active wave guiding region comprising a pulsed light generating region in which pulsed light is guided during respective sequential light pulse cycles, the pulse light generating region extending longitudinally in the direction of pulsed light propagation, and an adjacent light propagating region in which light is propagated, and (b) during each light pulse cycle the carrier density profile across the active wave guiding region progressively varies such that initially the carrier density in the pulse light generating region rises relative to the carrier density in the light propagating region until the difference between the refractive index of the pulse light generating region and the refractive index of the light propagating region is at its greatest, and the carrier density of the pulse light generating region reaches its lasing threshold value, thus causing lasing to commence in the active wave guiding region, and the lasing in the pulse light generating region progressively reduces the carrier density therein, which in turn progressively reduces the relative difference between the refractive index of the pulse light generating region and the light propagating region until the refractive index of the pulse light generating region approaches the refractive index of the light propagating region, thereby increasing guiding of the lasing light into the pulse light generation region for emission of the light pulse therefrom, at which stage the carrier density of the active wave guiding region falls below its lasing threshold value extinguishing the lasing light, and the next light pulse cycle commences.

The advantages of the invention are many. A particularly important advantage of the self-pulsating laser diode according to the invention is that it enables relatively simple, inexpensive and efficient self-pulsating lasers which emit light of wavelengths less than 800 nm to be provided. In particular, the self-pulsating laser according to the invention can be provided to produce pulsating light of wavelengths of approximately 650 nm, which is the optimum wavelength for reading data on CDs, CD-ROMs, DVDs, and other such optical discs.

Furthermore, it has been found that the laser diode is particularly suitable for providing pulsed light of wavelengths up to 1,700 nm, and indeed, the laser diode according to the invention is particularly suitable for providing pulsed light of 600 nm, 650 nm, 700 nm, 980 nm, 1,300 nm and 1,550 nm, as well as 1,700 nm.

BRIEF DESCRIPTION OF THE DRAWINGS

The invention will be more clearly understood from the following description of some preferred embodiments thereof, which are given by way of example only, with reference to the accompanying drawings, in which.

DETAILED DESCRIPTION OF THE INVENTION

Figure 1:
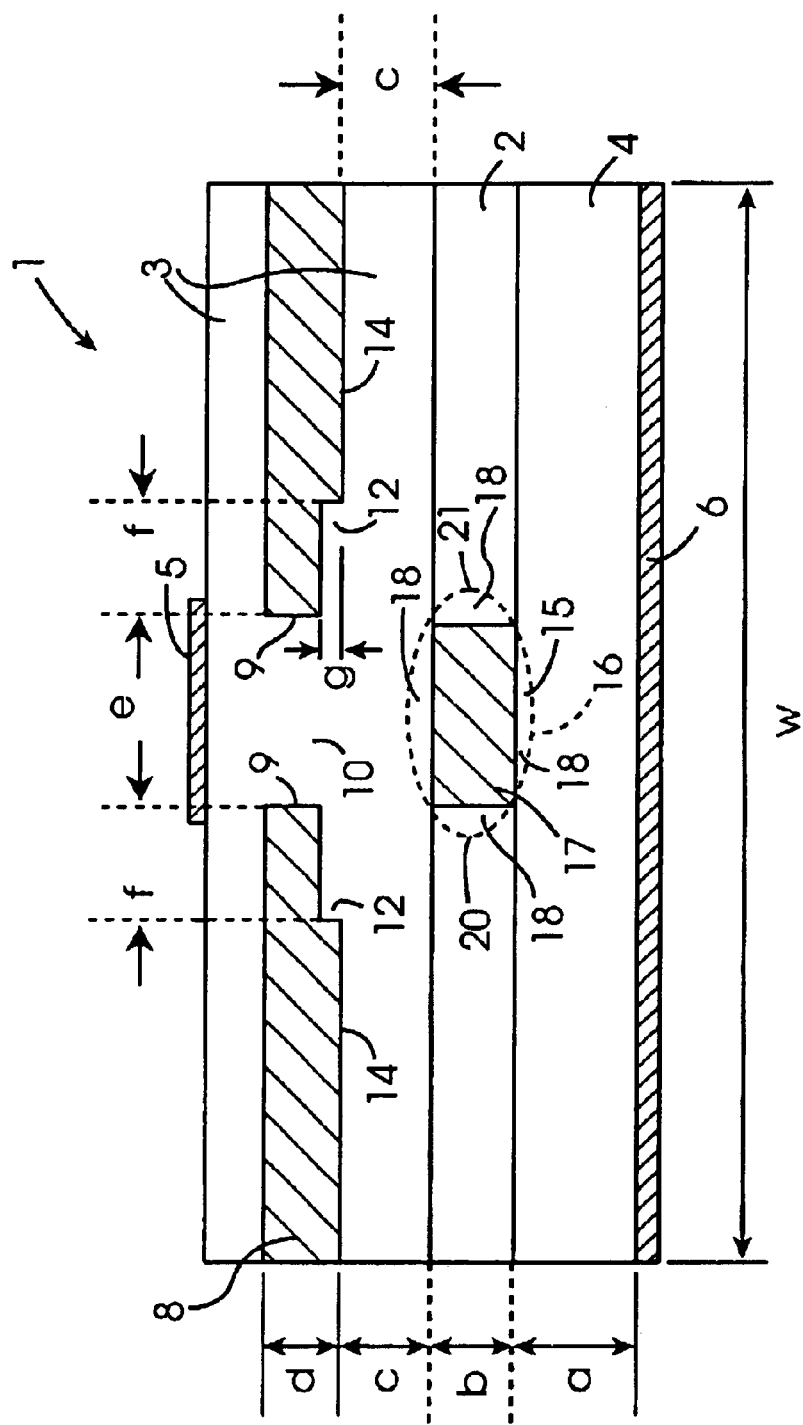
FIG. 1 is a cross-sectional schematic representation of a semiconductor self-pulsating laser diode according to the invention.

Referring to the drawings and initially to FIG. 1, there is illustrated a self-pulsating semiconductor laser diode according to the invention, indicated generally by the reference numeral 1 for emitting a train of light pulses in respective sequential light pulse cycles. The laser diode 1 comprises a wave guiding layer 2 sandwiched between an upper cladding layer 3 and a lower cladding layer 4. An upper electrically conductive contact plate 5 and a lower electrically conductive contact plate 6 formed on the upper and lower cladding layers 3 and 4, respectively facilitate pumping a current through the laser diode 1. A current blocking layer 8 is formed in the upper cladding layer 4 and terminates in longitudinally extending side edges 9 which define an elongated longitudinally extending slot 10 which forms a current passageway for current passing from the upper contact plate 5 to the lower contact plate 6 through the upper and lower cladding layers 3 and 4 and the wave guiding layer 2. Recesses 12 formed in the side edges 9 and a lower major face 14 of the current blocking layer 8 which is facing the wave guiding layer 2 are shaped to define with the slot 10 an active wave guiding region 15 which is within and defined by the broken line 16, in which light is propagated.

The upper and lower cladding layers 3 and 4 are parallel to each other and parallel to the wave guiding layer 2. The current blocking layer 8 is also parallel to the wave guiding layer 2, as are the upper and lower contact plates 5 and 6. The slot 10 formed in the current blocking layer 8 extends longitudinally into the page for forming the active wave guiding region 15, also extending longitudinally into the page. Additionally, the slot 10 and recesses 12 formed in the current blocking layer 8 as well as defining the active wave guiding region 15 also defines within the active wave guiding region 15 a central pulse light generating region 17 within which the light pulses of the pulse train are guided and from which the light pulses are emitted, and an outer light propagating region 18 which extends around and surrounds the central pulse light generating region 17. The central pulse light generating region 17 and the outer light propagating region 18 extends into the page and the central pulse light generating region 17 defines the direction in which the pulsed light is propagated therein. Although not illustrated, quantum wells are provided in the wave guiding layer 2, and the provision of such quantum wells will be well known to those skilled in the art.

The material of the wave guiding layer 2 is selected and the light blocking layer 8 and the recesses 12 are arranged so that when the laser diode is unpumped, the refractive index of the light propagating region 18 is substantially similar to the refractive index of the adjacent wave guiding layer 2, and when the laser diode is highly pumped the refractive index of the light propagating region 18 is greater than the refractive index of the adjacent wave guiding layer 2. Furthermore, the transition of the refractive index of the wave guiding layer 2 to the refractive index of the light propagating region 18 at the boundary 16 between the light propagating region 18 and the wave guiding layer 2 is a step transition, as will be described below.

Referring now to FIGS. 2(a) to (c), a portion of a light pulse cycle of the laser diode 1 in generating one light pulse will now be described. FIGS. 2(a) to (c) illustrate the progression of the carrier density profile, the effective refractive index profile and the photon density profile across the active wave guiding region 15 from one lateral side boundary 20 to the other lateral side boundary 21. The progression of the carrier density profile, the effective refractive index profile and the photon density profile as illustrated in FIGS. 2(a) to (c) have been prepared based on a computer simulation of a computer model of the laser diode 1. FIG. 2(a) illustrates the progression of the carrier density profile during the portion of the light pulse cycle in five blocks, namely, blocks a1, a2, a3, a4 and a5. The effective refractive index profiles illustrated in blocks b1, b2, b3, b4 and b5 are at corresponding times to blocks a1 to a5, respectively. Similarly, the photon density profiles illustrated in blocks c1, c2, c3, c4 and c5 are at corresponding times to the carrier density profile of blocks a1 to a5, respectively.

Figure 2:
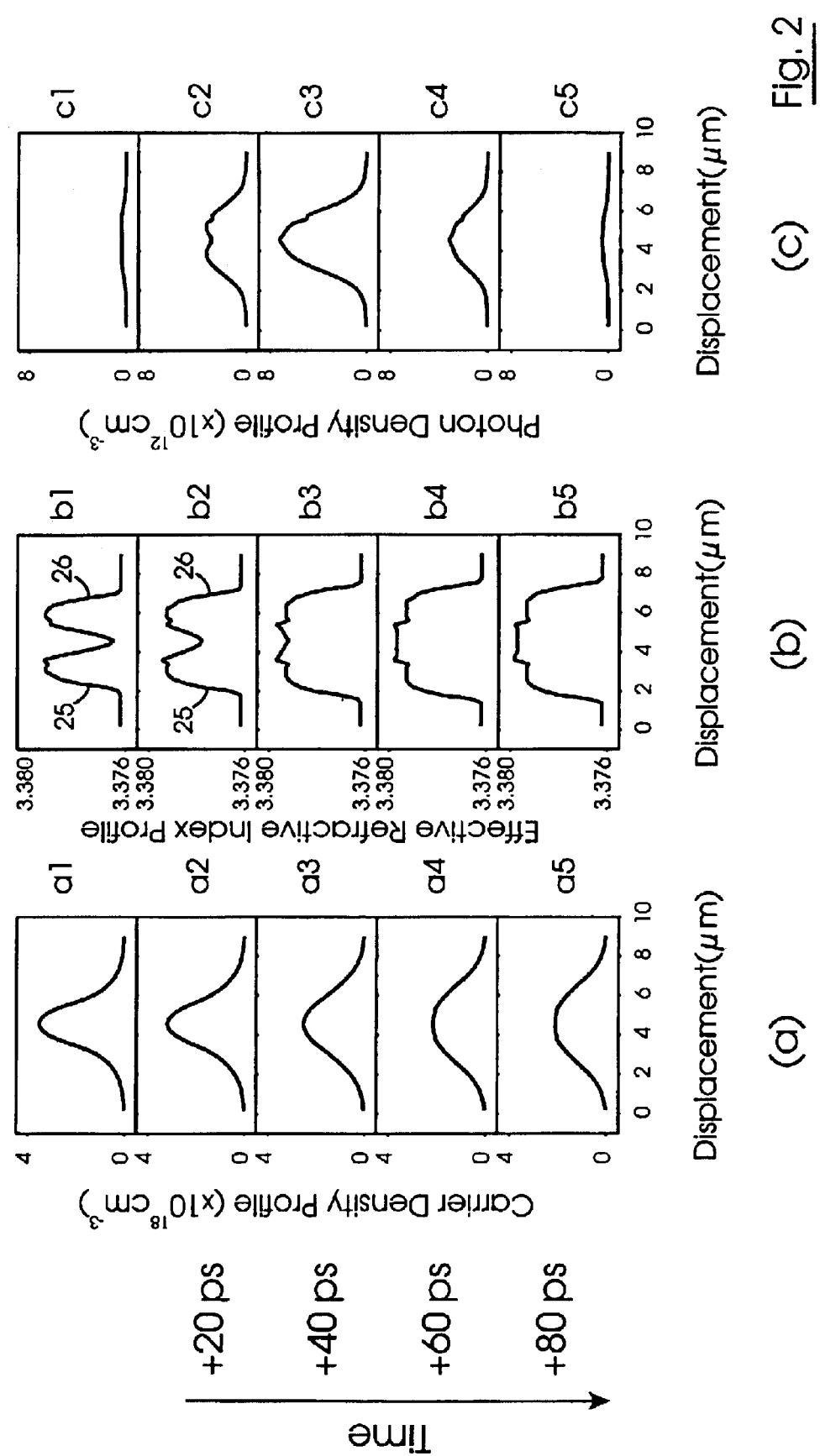
FIGS. 2(a) to (c) illustrate a series of computer simulation results representing interaction between carrier density profile, refractive index profile and photon density profile of the laser diode of FIG. 1.

Initially in each light pulse cycle as the laser diode is being pumped, the carrier density in the central pulse light generating region 17 rises relative to the carrier density in the outer light propagating region 18 until the difference between the refractive index of the central pulse light generating region 17 and the refractive index of the outer light propagating region 18 is at its greatest, and the carrier density of the central pulse light generating region 17 reaches its lasing threshold value. At that stage lasing commences in the active wave guiding region 15, and by virtue of the fact that the refractive index of the outer light propagating region 18 is significantly higher than the refractive index of the central pulse light generating region 17, lasing light in the active wave guiding region 15 is guided in the outer light propagating region 18. This is the stage of the light pulse cycle illustrated in the blocks a1, b1 and c1. As can be seen from the carrier density profile in block a1, the carrier density in the centre portion of the curve which corresponds with the central pulse light generating region 17 is at its highest, and the difference between the refractive index of the central pulse light generating region 17 and the refractive index of the light propagating region 18 is at its greatest. The side portions of the carrier density profile correspond to the outer light propagating regions 18. Block a2 of FIG. 2 illustrates the carrier density profile during the light pulse cycle at a time plus 20 ps from block a1. The carrier density profiles illustrated in blocks a3, a4 and a5 are at times 40 ps, 60 ps and 80 ps from block a1, respectively, block a5 illustrating the carrier density profile at the end of the emission of the light pulse. No further lasing light is emitted before the beginning of the next light pulse cycle at approximately 320 ps later.

The step change in the refractive indices of the wave guiding layer 2 and the outer light propagating region 18 at the boundary 16 at 20 and 21 is represented by the legs 25 and 26, respectively, in the effective refractive index profile curves of blocks b1 to b5.

Accordingly, by the time each light pulse cycle reaches the state of blocks a1, b1 and c1, and the carrier density profile across the active wave guiding region 15 is as illustrated in block a1 with the difference between the carrier density of the central pulse light generating region 17 and the carrier density of the outer light propagating region 18 at its maximum the refractive index of the central pulse light generating region 17 is less than the refractive index of the outer light propagating region 18, and the differential between the respective refractive indices of the central pulse light generating region 17 and the light propagating region 18 is at its maximum. The amount by which the refractive index of the central pulse light generating region 17 is less than that of the outer light propagating region 18 at the beginning of the cycle is substantially similar to the amount by which the refractive index of the outer light propagating region 18 is greater than that of the wave guiding layer 2. In this condition the photon density profile across the active wave guiding region 15 is at its minimum, since lasing in the active wave guiding region 15 is only commencing.

Two physical effects, as well as stimulated emission of light play a role in dynamically modifying the relative difference between the refractive indices of the central pulse light generating region 17 and the outer light propagating region 18, namely, photopumping of the outer light propagating region 18, and charge carrier diffusion from the central pulse light generating region 17 to the outer light propagating region 18.

Light produced in the outer light propagating region is guided by the refractive index steps at the boundary between the active wave guiding region 15 and the wave guiding layer 2. The variation in the carrier density across the active wave guiding region 15 has the effect of modifying the effective refractive index experienced by light propagating in the active wave guiding region 15. Initially, the emission of light due to stimulated emission causes charge carriers to be progressively consumed in the high carrier density region, namely, in the central pulse light generating region 17, thus causing the refractive index of the central pulse light generating region 17 to progressively increase, see block a2 and b2. Additionally, photopumping of the outer light propagating region 18 thus leads to an effective transfer of charge carriers from the central pulse light generating region 17 to the adjacent edges of the central pulse light generating region 17. This photopumping effect is in general a more efficient medium for the distribution of charge carriers within the active wave guiding region 15 than charge carrier diffusion alone, and is a relatively powerful additional means for accomplishing dynamic modification of the carrier induced anti-guiding effect. As the lasing intensity progressively increases, the charge carriers recombine due to the stimulated emission of light.

When the refractive index is highest in the outer light propagating region 18, light is propagated in this region in preference to the central pulse light generating region 17. The light propagating in the outer light propagating region 18 causes charge carriers to migrate from the central pulse light generating region 17 to the outer light propagating region 18, thereby progressively reducing the refractive index differential of the central pulse light generating region 17 as the cycle progresses. As the charge carriers migrate towards the outer light propagating region 18, they further reduce the carrier density, and in turn increasing the refractive index of the central pulse light generating region 17. As a consequence of these effects together with stimulated recombination of electron-hole pairs in the pulse light generating region 17, the refractive index of the central pulse light generating region 17 reaches the refractive index of the outer light propagating region 18, thus guiding the lasing light into the central pulse light generating region 17, see blocks a3, b3 and c3. At this stage the light pulse is emitted from the central pulse light generation region 17. The photon density profile across the active wave guiding region 15 then falls off as illustrated in blocks c4 and c5. The absence of lasing light in the active wave guiding region 15 eventually returns the carrier density profile and the effective refractive index profile of the active wave guiding region 15 to that illustrated in blocks a1 and b1, respectively, approximately 320 ps later and so the next light pulse cycle commences.

In order to produce a laser diode with pulsed light emission of 650 nm, the wave guiding layer 2 of the laser diode 1 is formed of AlGaInP. However, it will be readily apparent to those skilled in the art that in order to provide a pulsed light emission of other wavelengths, the material of the wave guiding layer 2 will be appropriately selected.

In order to demonstrate the effectiveness of the laser diode 1 according to the invention, a simulated computer model has been generated using standard computer model simulation which will be well known to those skilled in the art. As a result of the computer model simulation, various parameters of the laser diode 1 according to the invention have been computed, and these are illustrated in FIGS. 3 to 11, and will now be discussed. In the preparation of the computer model, the critical dimensions of the laser diode have been selected as follows:

| | |
|---|---|
| Depth of lower cladding layer 4 dimension a | 1.5 μm |
| Depth of wave guiding layer 2 dimension b | 0.1 μm |
| Depth of upper cladding layer between the wave guiding layer and the light blocking layer dimension c | 0.1 μm |
| Depth of current blocking layer dimension d | 2.0 μm |
| Width of slot 10 in current blocking layer 8 dimension e | 2.0 μm |
| Width of each recess 12 in lateral dimension f | 2.0 μm |
| Depth of recess 12 in growth direction of laser diode dimension g | 0.05 μm |
| Width of laser diode in lateral direction, dimension w | 200 μm |
| Length of laser diode in the direction of light propagation, namely into the page of FIG. 1 | 300 μm |

The laser diode was assumed to be pumped with a DC bias current of 85 mA.

Figure 3:
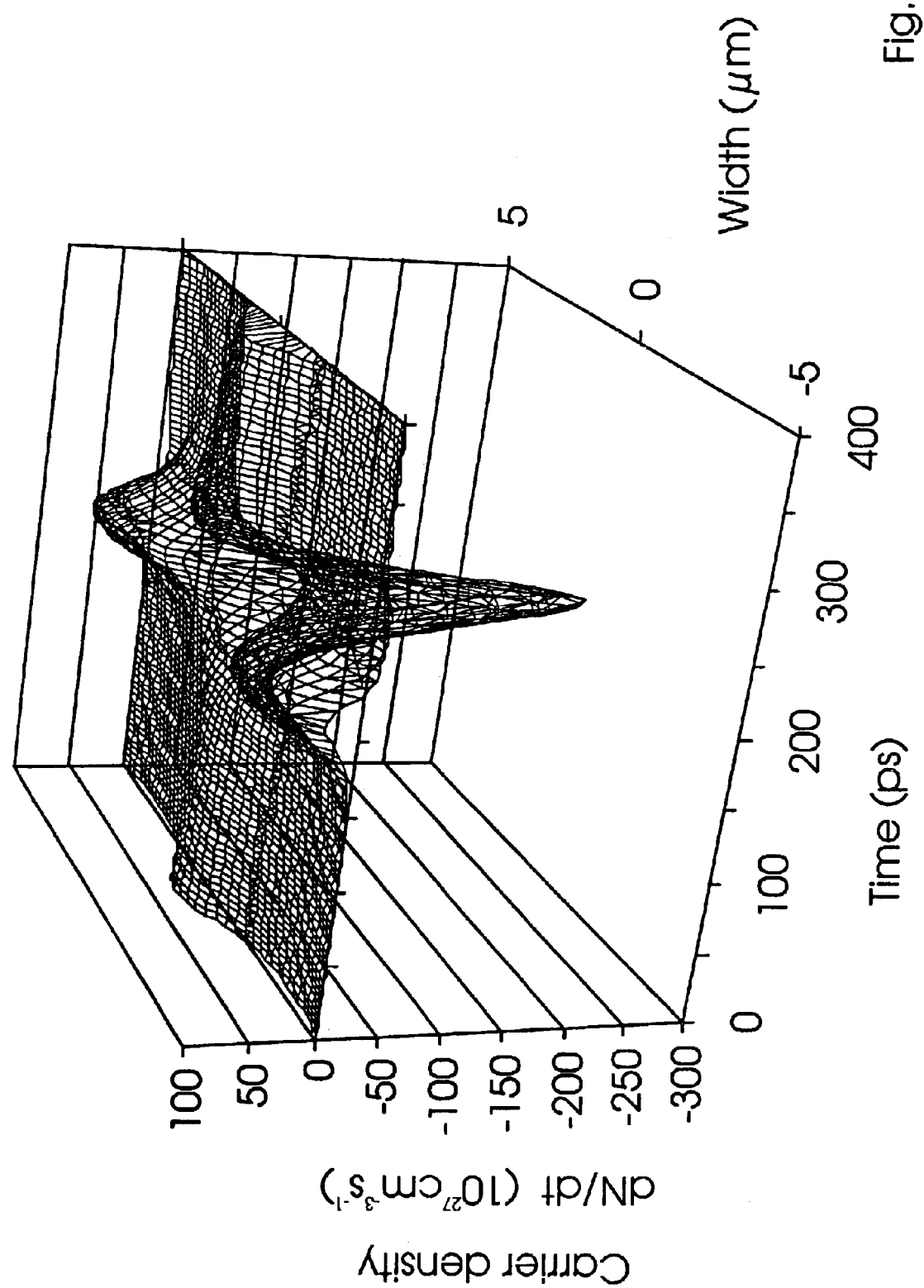
FIG. 3 illustrates a computer simulated spatial and temporal evolution of the change in carrier density over a light pulse cycle with the peak pulse emitted at approximately 200 ps in the laser diode of FIG. 1.

FIG. 3 illustrates a three-dimensional plot of spatial and temporal variations in the rate of change of carrier density dN/dt over time and space during a complete light pulse cycle, from time 0 to time 400 ps, in the active wave guiding region 15. The vertical scale represents a plot of change in carrier density per unit time. Before the light pulse is emitted, the carrier density in the central pulse light generating region 17 slowly increases due to the application of an electric current, the time scale of the rise is determined by the charge carrier dynamic time scales (recombination lifetime, charge carrier diffusion, etc.). At the beginning of the emission of the pulse, charge carriers are rapidly depleted from the central pulse light generating region 17. The number of charge carriers in the outer light propagating region 18 increases due to absorption of some of the developing emission. The combination of these two effects leads to a strong focusing of the emission within the central pulse light generating region 17. At the tail end of the pulse, the carrier density increases in the central pulse light generating region 17 while it continues to decrease slightly in the outer light propagating region 18. This leads to a slight defocusing of the emission at the end of the pulse.

Figure 4:
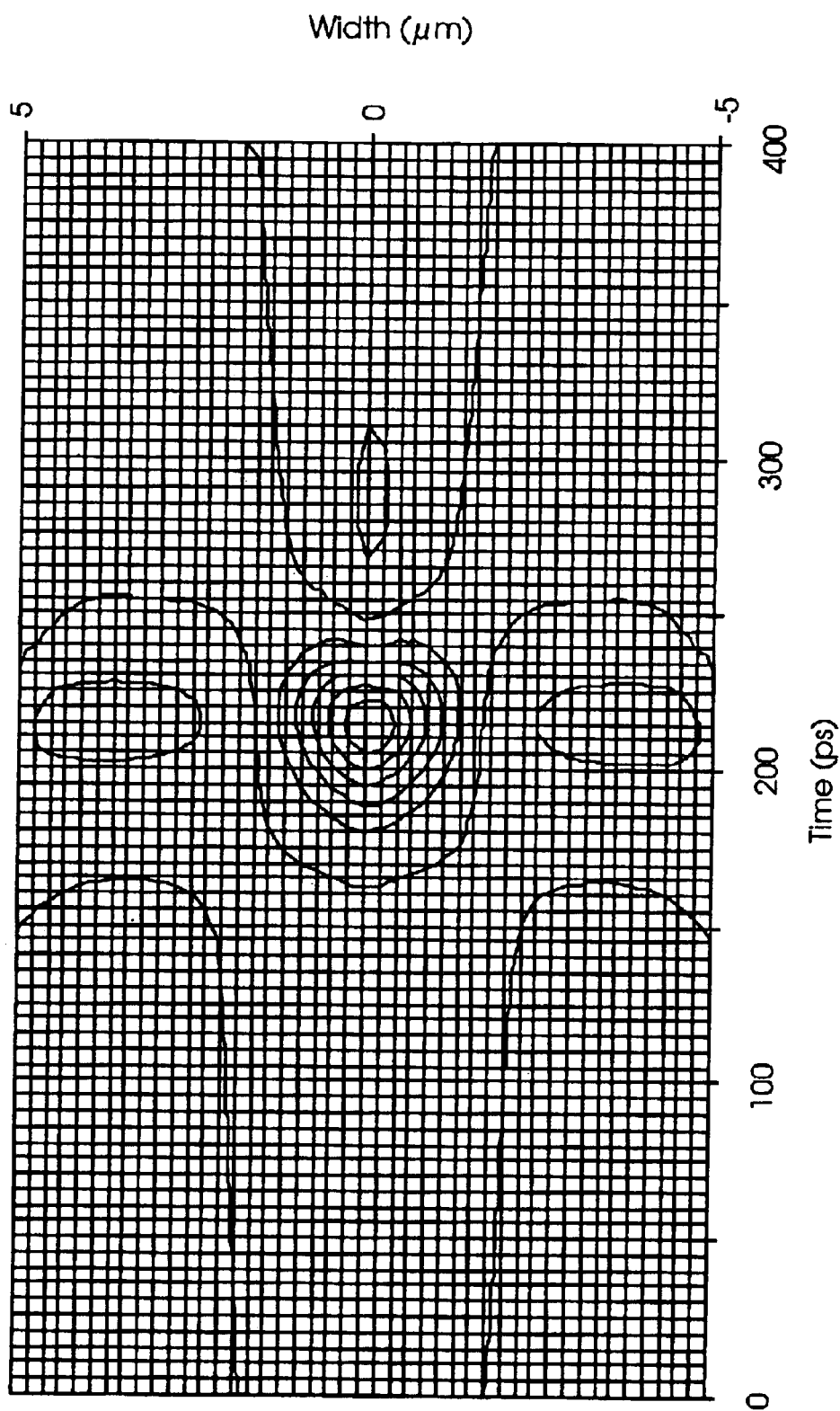
FIG. 4 illustrates a computer simulated contour plot of change in the carrier density, of the data shown in FIG. 3.

FIG. 4 illustrates the contour of a plot of the change in carrier density across the active wave guiding region 15 when viewed in plan view during a light pulse cycle from time zero to time 400 ps. The charge carrier generation spreads slowly across the active wave guiding region 15 from the central pulse light generating region 17 to the outer light propagating region 18 as the carrier density reaches its maximum value. The central pulse light generating region 17 then undergoes strong carrier depletion due to stimulated emission. The carrier density in the outer light propagating region 18 increases with absorption of some of the emitted light. This photopumping process reaches a maximum as the depletion of charge carriers in the central pulse light generating region 17 reaches a minimum. The carrier density in the central pulse light generating region 17 continues to drop but at a slower rate until the pulse is completely emitted, at which point charge carrier injection causes a steady increase towards the next pulse emission. It can also be seen that the temporal shape of the depletion in the central pulse light generating region 17 which matches the shape of the stimulated protons is lopsided. The rise is longer than the fall time for the pulse.

Figure 5:
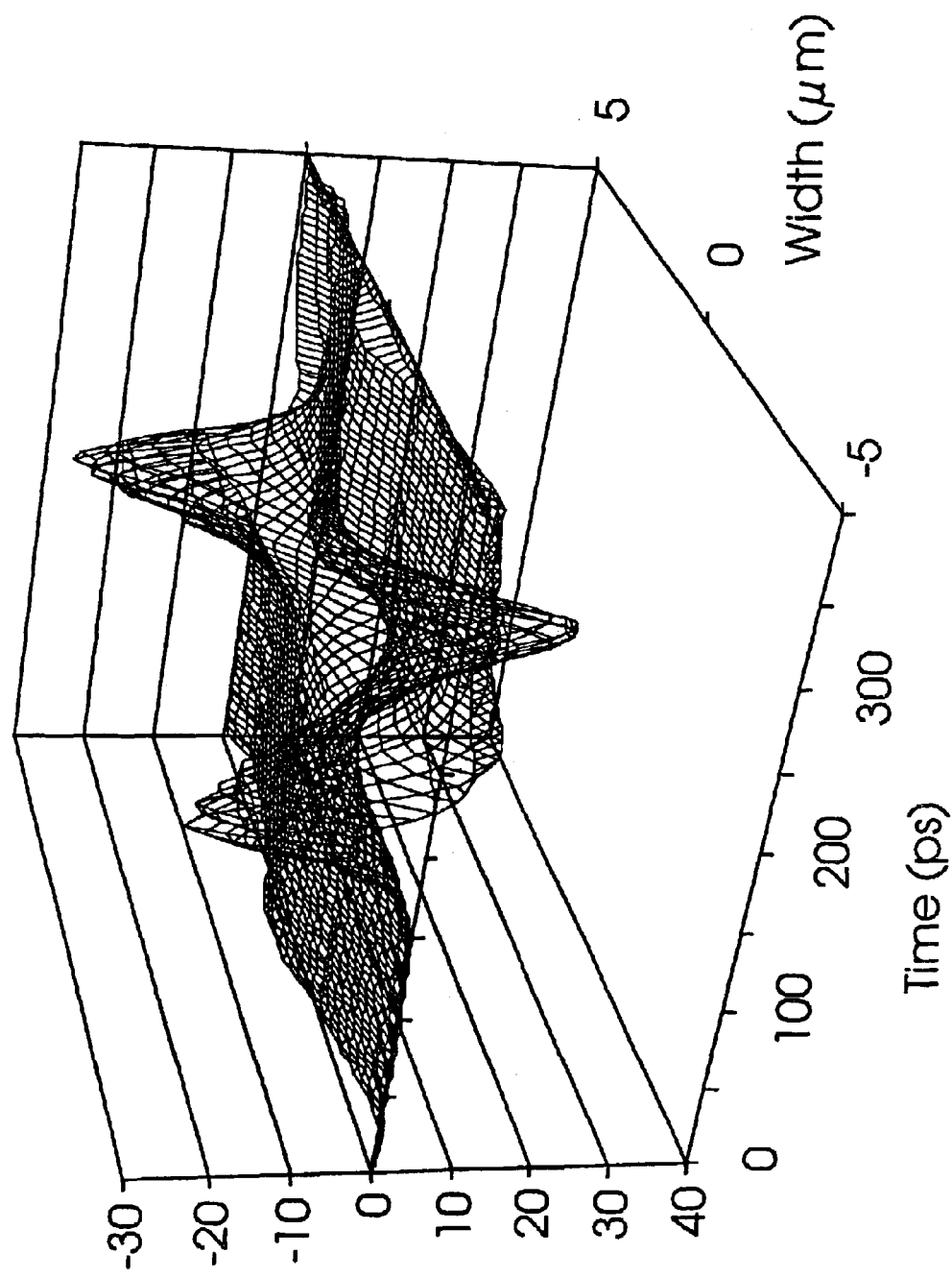
FIG. 5 illustrates a computer simulated spatial and temporal evolution of the change in gain during a pulse cycle in the laser diode of FIG. 1.

The change in carrier density profile causes similar modifications to the available gain. FIG. 5 illustrates the temporal and spatial evolution of the change in gain in the laser diode. The Z axis shows the change in gain with time, dG/dt, the X axis denotes time from time 0 to time 400 ps of a light pulse cycle, and the Y axis distance across the active wave guiding region 15 when viewed in plan. The gain is depleted in the central pulse light generating region 17 by the emission of the pulse, but increases rapidly in the outer light propagating region 17 as charge carriers are generated due to absorption.

Due to the non-linear variation in gain with carrier density, a change in the carrier density in the outer light propagating region 18 has a much greater effect on the gain than a change in the carrier density in the central pulse light generating region 17. There is therefore a large increase in the gain in the outer light propagating region 18, which while not causing the outer light propagating region 18 to reach transparency, does significantly reduce the absorption, allowing the optical mode to spread further into the outer light propagating region 18.

Figure 6:
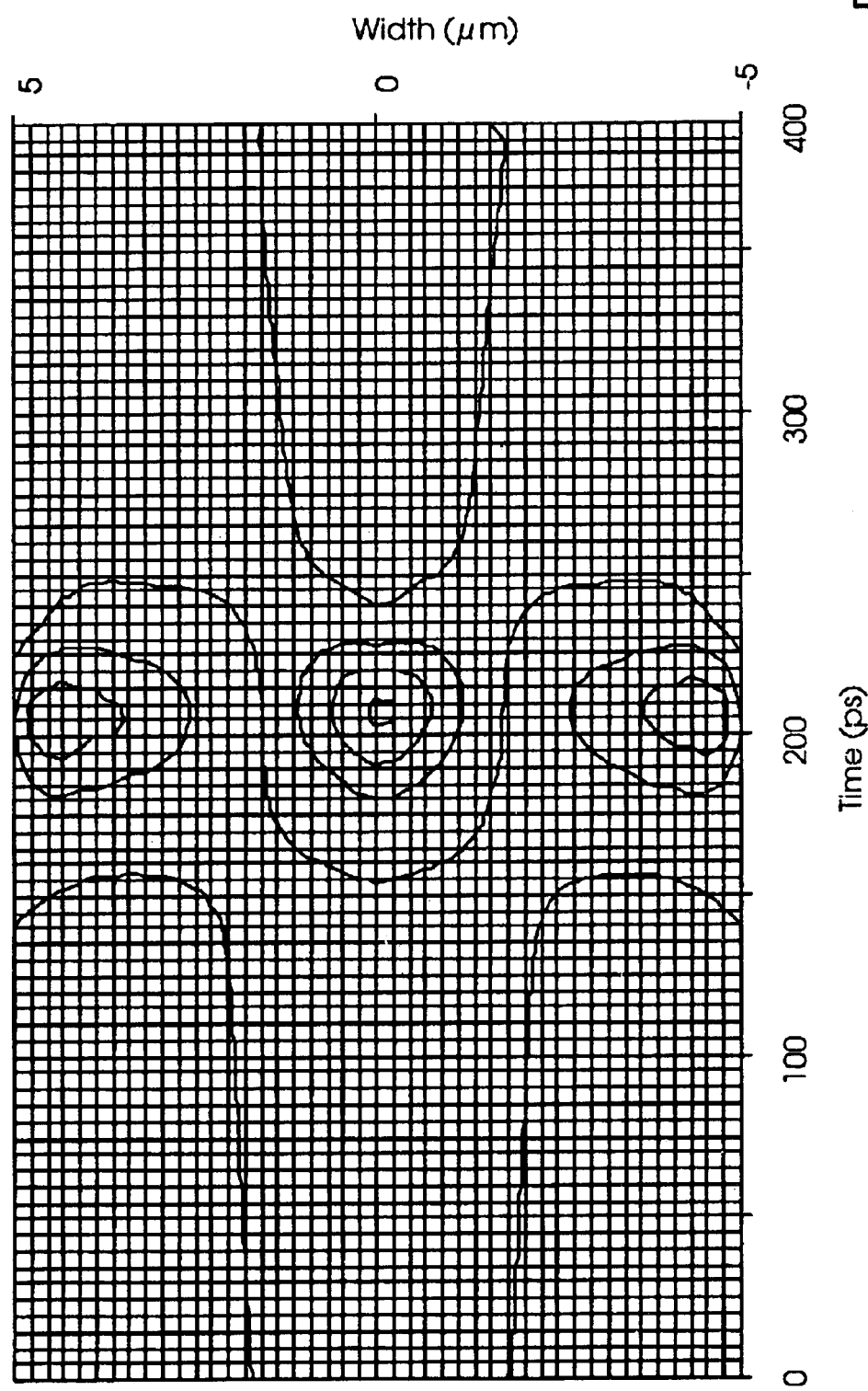
FIG. 6 illustrates a contour plot of the computer simulated change in gain of the laser diode of FIG. 1 as shown in FIG. 5.

FIG. 6 illustrates a contour plot of the gain profile from FIG. 5 over a light pulse cycle from time 0 to 400 ps. The changes in gain follow the changes in carrier density shown in FIG. 4. There is a large increase in the gain in the outer light propagating region 18 during the emission of the light pulse, but a drop at the end of the light pulse as light is still being emitted from the outer light propagating region 18. The increase in gain broadens from the central pulse light generating region 17 out into the outer light propagating region 18 during the light pulse cycle. This broadening reaches its maximum just before the light pulse is emitted. As the light pulse is emitted, there is a large increase in gain in the outer light propagating region 18 as photons are absorbed creating charge carriers. The change in carrier density causes a modification of the refractive index, and thus a change in the wave guiding properties of the optical mode.

Figure 7:
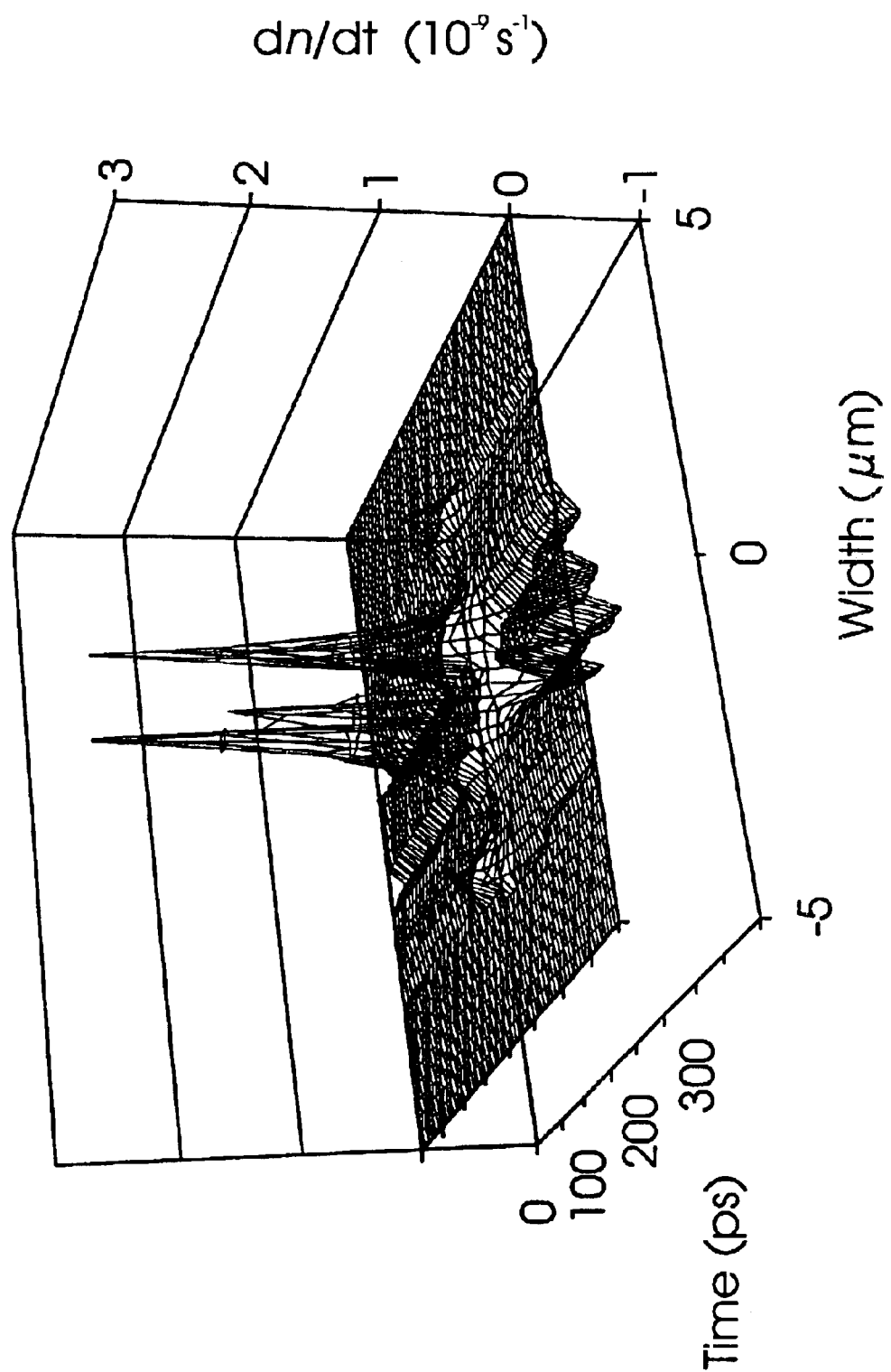
FIG. 7 illustrates a computer simulated spatial and temporal evolution of the change in the refractive index in the laser diode of FIG. 1.

FIG. 7 shows the variation of the refractive index, dn/dt caused by the gain and carrier density profile over a light pulse cycle from time 0 to 400 ps. It is apparent therefore that the laser diode is undergoing significant refractive index variation in the wave guiding region 15 during each light pulse cycle. The modification to the refractive index is greater at the outer edges of the outer light propagating region 18. This in turn focuses the optical mode during the light pulse confining a large fraction of the light in the central pulse light generating region 17. The large increase in gain and carrier density in the outer light propagating region 18 broadens the base of the optical mode profile spreading the unconfined light across a wide cross-section of the active wave guiding region 15.

Figure 8:
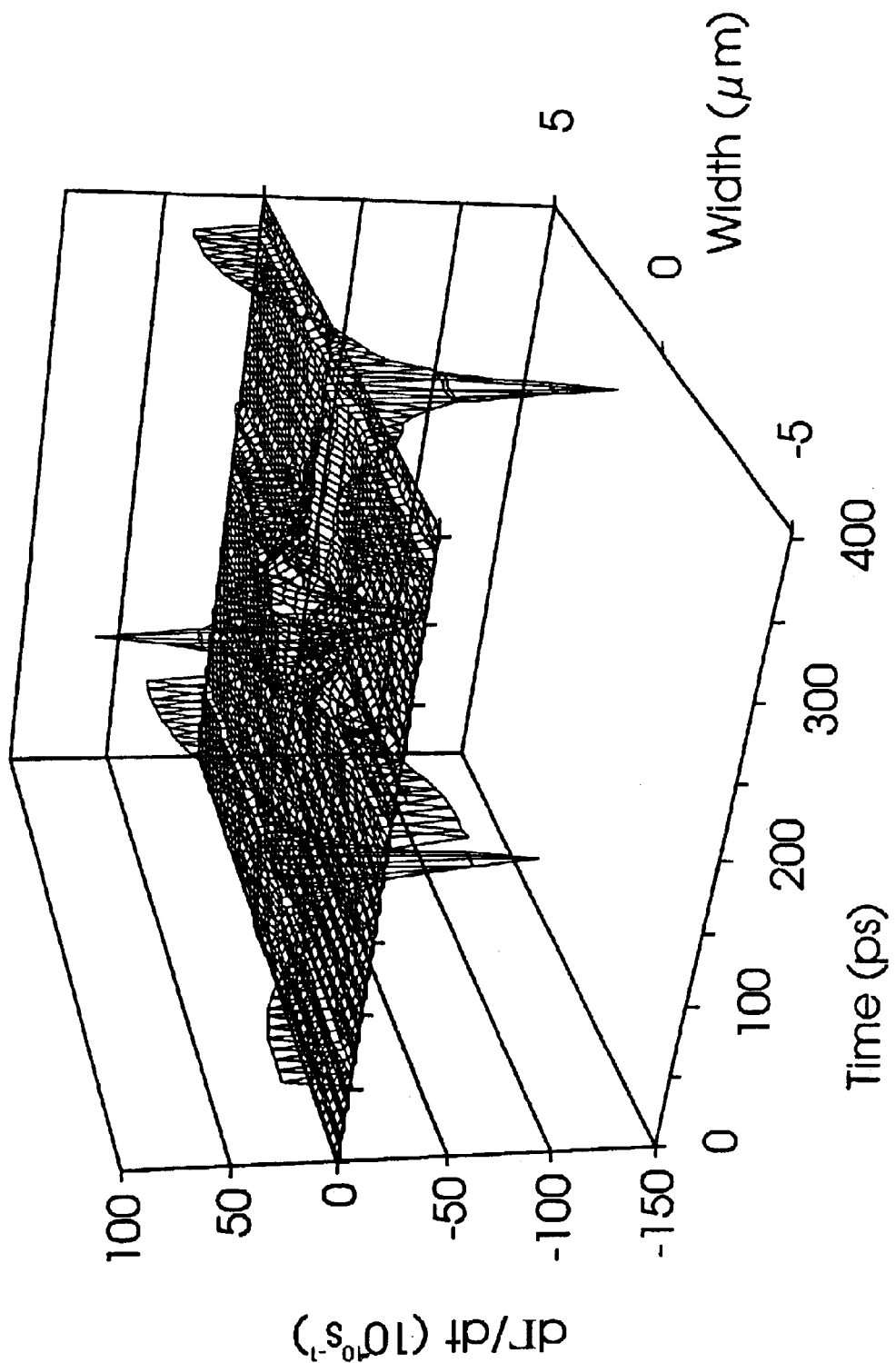
FIG. 8 illustrates a computer simulated spatial and temporal evolution of the change in confinement factor in the laser diode of FIG. 1.

The effects of changes in the carrier density, gain and refractive index on the optical mode profile are illustrated in FIG. 8. The X axis extends in the direction of light propagation and represents time from time 0 to time 400 ps. The Y axis in the lateral direction of light propagation represents the lateral co-ordinates, and the Z axis in the growth direction of the laser diode represents the change in confinement factor per unit time, $d\Gamma/dt$. At 50 ps and 475 ps the confinement factor decreases in the central pulse light generating region 17 and increases in the outer light propagating region 18. This corresponds to a defocusing of the optical mode between pulses. During the emission of the light pulse, a focusing effect occurs with the optical mode increasing in the central pulse light generating region 17 and decreasing in the outer light propagating region 18. The change in shape of the mode is quite striking, with a sharp confinement below the contact stripe but a broader confinement into the outer light propagating region 18. This defocusing and focusing during the light pulse cycle is important for the self-pulsation process, and is a direct result of the diffusion and absorption of charge carriers into the outer light propagating region.

Figure 9:
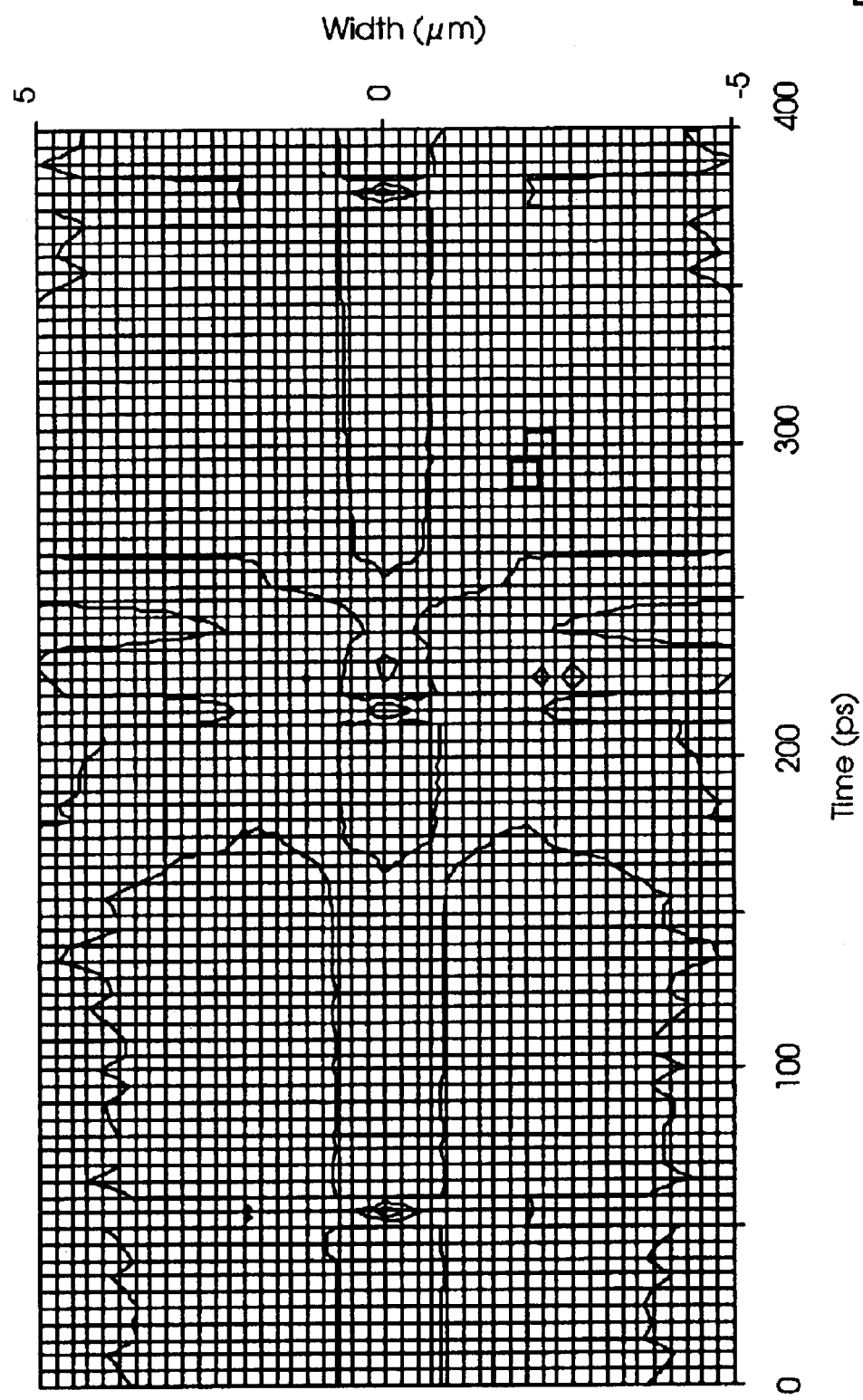
FIG. 9 illustrates a contour plot of a computer simulated change in the optical mode profile in the laser diode of FIG. 1.

FIG. 9 illustrates a contour plot of the change in confinement factor $\Gamma$. It becomes clear that the defocusing at the midpoint between pulses is a sharp feature. The overlap reaches its minimum value across the central pulse light generating region 17. Unlike the three-dimensional graph, the contour plot also shows that at the end of the pulse a defocusing effect occurs in the central pulse light generating region 17. This is a broad feature that spreads the light mode further into the outer light propagating region 18 as the central focused mode peak collapses. This generates a concave lateral shape to the confinement factor, which is seen at about 250 ps on the graph. While the optical mode profile is rapidly changing, emission of stimulated light follows the gain profile and emission of spontaneous light follows the carrier density profile.

Figure 10:
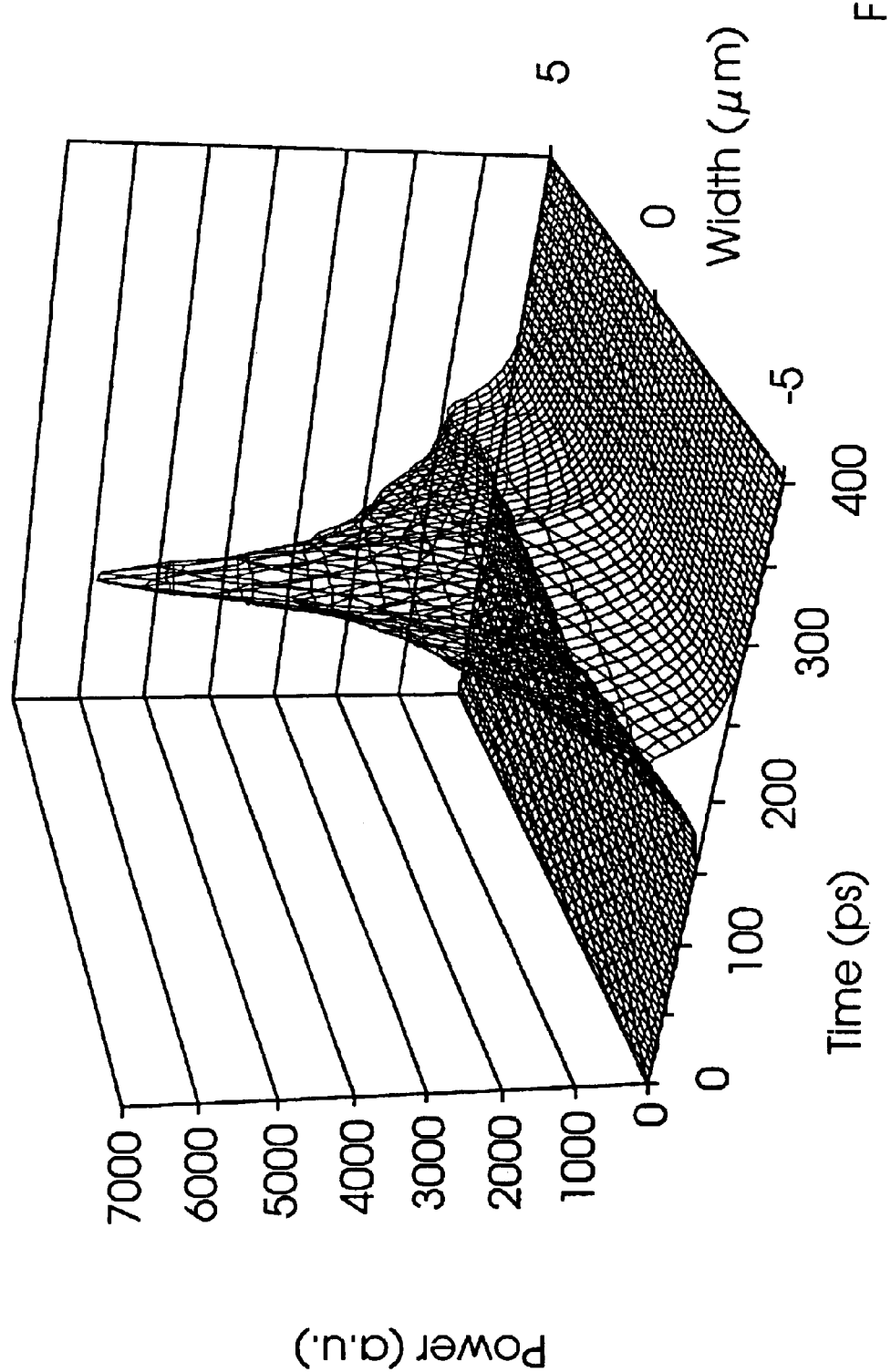
FIG. 10 illustrates computer simulated spatial and temporal evolution of the emitted light in the laser diode of FIG. 1.
Figure 11:
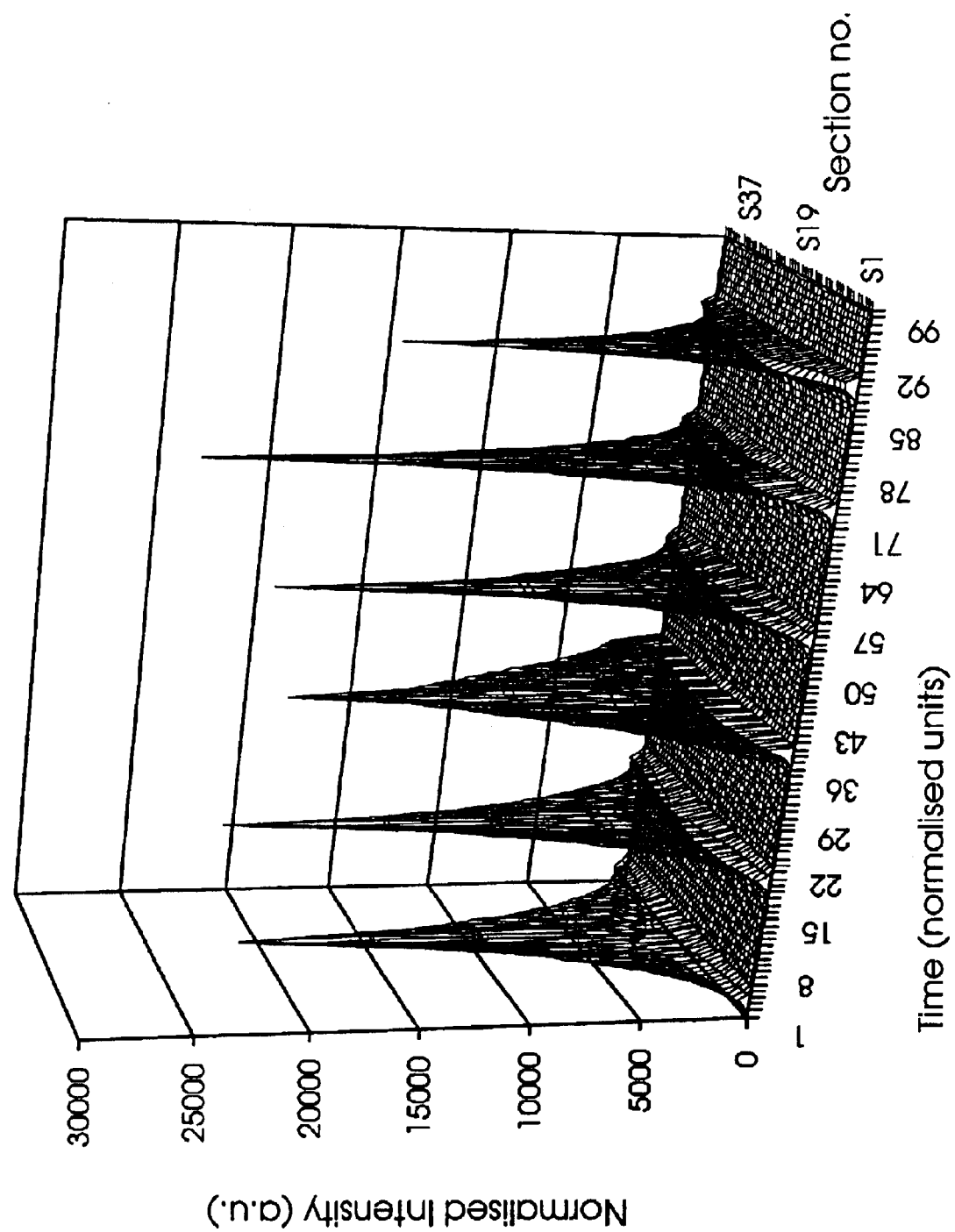
FIG. 11 illustrates the results of a computer simulation of a train of pulses propagating through the laser diode of FIG. 1.

FIG. 10 shows the emitted light from the laser diode during a light pulse cycle from time 0 to 400 ps. The Z axis plots the power in arbitrary units, the X axis plots the time from time 0 to time 400 ps, and the Y axis the distance. FIG. 11 shows a train of light pulses.

As discussed above, there are a number of design characteristics which influence the optical mode, and therefore may be used to optimise the interaction between the refractive index guiding and the gain guiding in order to achieve self-pulsating emission.

A laser diode of similar construction to the laser diode of FIG. 1 described above but with the following alternative dimensions has also been shown to produce pulsating light at 650 nm:

| | |
|---|---|
| Depth of lower cladding layer 4 dimension a | 1.5 μm |
| Depth of wave guiding layer 2 dimension b | 0.10 μm |
| Depth of upper cladding layer between the wave guiding layer and the light blocking layer dimension c | 0.10 μm |
| Depth of current blocking layer dimension d | 1.5 μm |
| Width of slot 10 in current blocking layer 8 dimension e | 2.0 μm |
| Width of each recess 12 in lateral dimension f | 2.0 μm |
| Depth of recess 12 in growth direction of laser diode dimension g | 0.05 μm |
| Width of laser diode in lateral direction, dimension w | 200 μm |
| Length of laser diode in the direction of light propagation, namely into the page of FIG. 1 | 300 μm |

Figure 12:
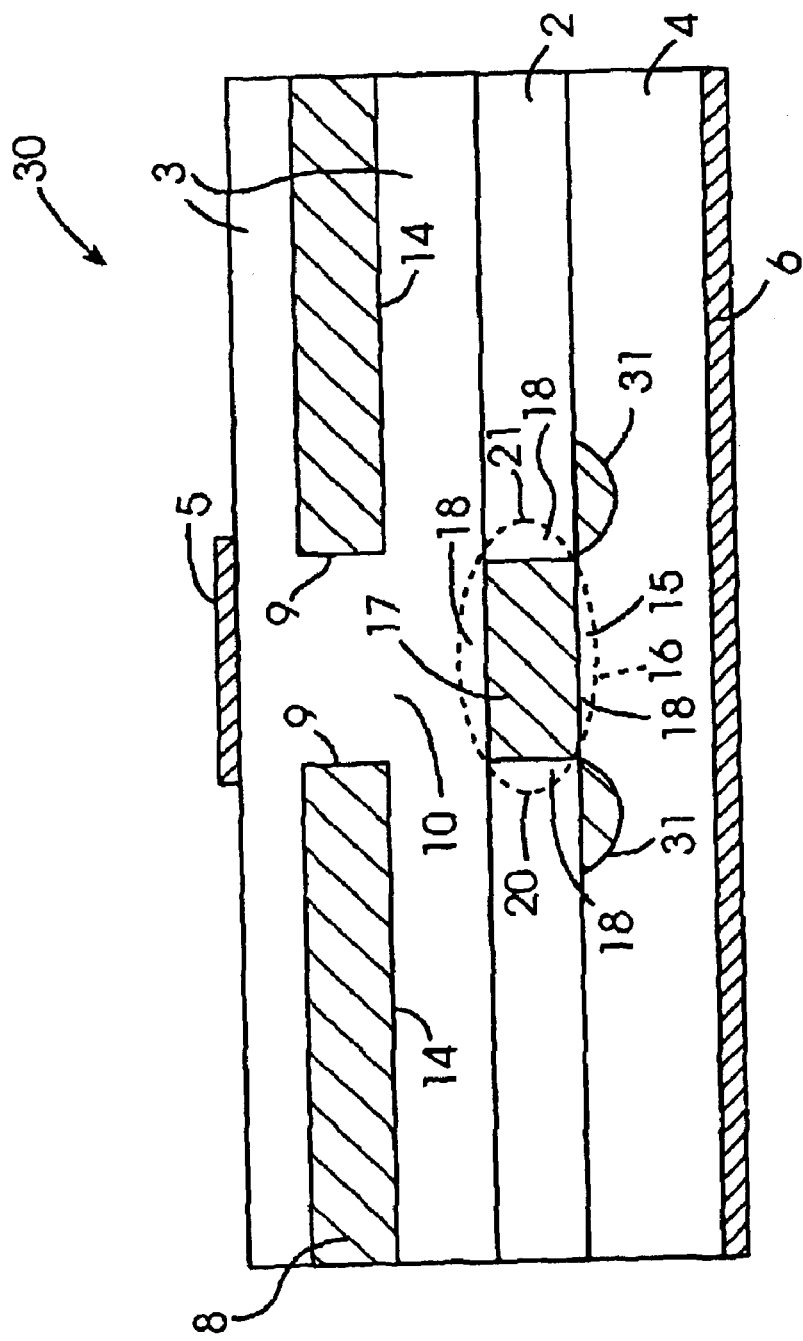
FIG. 12 is a cross-sectional schematic representation of a self-pulsating laser diode according to another embodiment of the invention.

Referring now to FIG. 12, a semiconductor self-pulsating laser diode according to another embodiment of the invention is illustrated and indicated generally by the reference numeral 30. The laser diode 30 is substantially similar to the laser diode 1 and similar components are identified by the same reference numerals. The main difference between the laser diode 30 and the laser diode 1 is that the recesses in the current blocking layer 8 have been omitted. In this embodiment of the invention the step change in the refractive index between the wave guiding layer 2 and the active wave guiding region 15, and the step in the refractive index between the outer light propagating region 18 and the central pulse light generating region 17 are matched at the beginning of a light pulse cycle by optimising the lower cladding layer 4. In this embodiment of the invention this is achieved by modifying the lower cladding layer 4 by forming spaced apart channels 31 on respective opposite sides of the active wave guiding region 15 extending longitudinally and parallel to the direction of light propagation. The channels are filled with the same material as that of the wave guiding layer 2. The effect of this is to cause the carrier density profile across the active wave guiding region 15 to vary as each light pulse cycle progresses as already described with reference to FIG. 2, and thus the effective refractive index profile and the photon density profile of the active wave guiding region 15 similarly varies as each light pulse cycle progresses as illustrated in FIG. 2.

Figure 13:
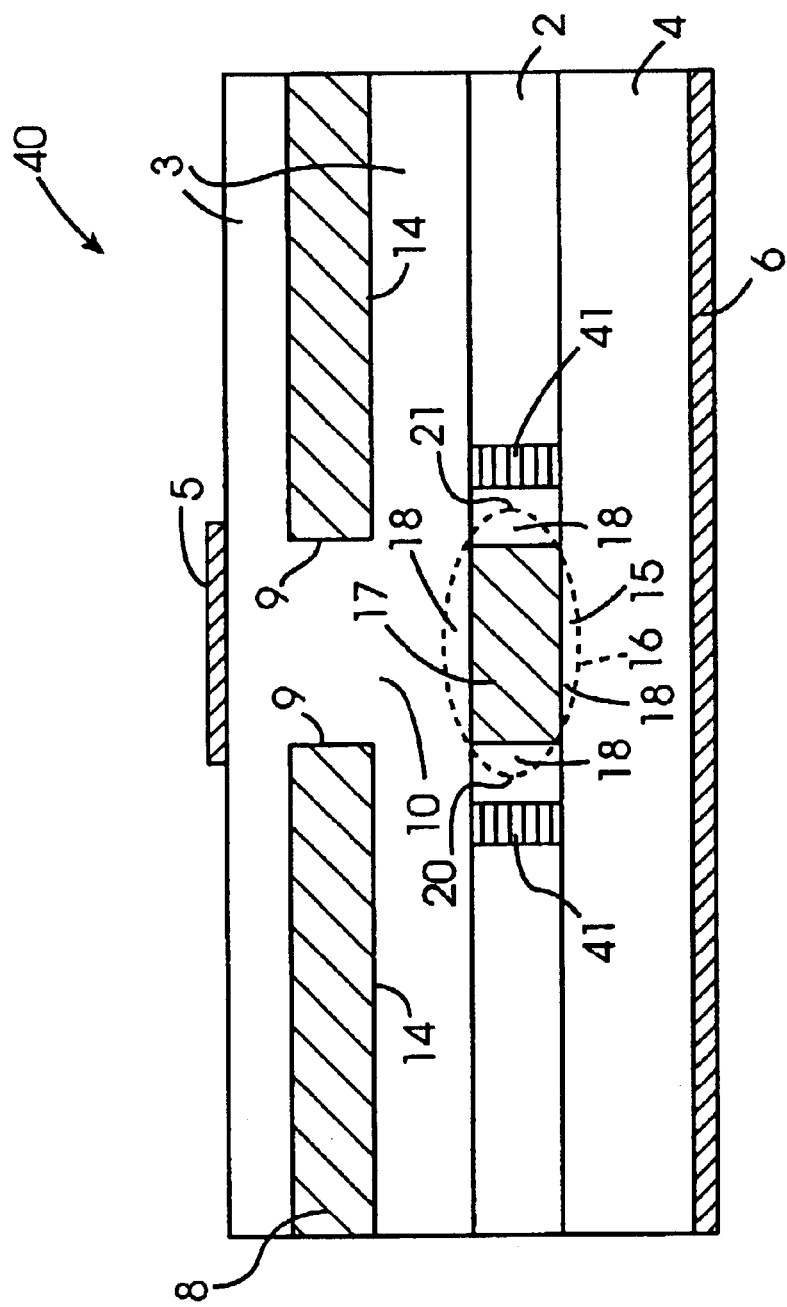
FIG. 13 is a cross-sectional schematic representation of a self-pulsating laser diode according to a further embodiment of the invention.

Referring now to FIG. 13, there is illustrated a self-pulsating semiconductor laser diode according to another embodiment of the invention, indicated generally by the reference numeral 40. The laser diode 40 is substantially similar to the laser diode 1 and similar components are identified by the same reference numerals. The main difference between the laser diode 40 and the laser diode 1 is that the recesses have been omitted from the current blocking layer 8. However, barrier means provided by spaced apart barrier sections 41 are provided in the wave guiding layer 2 on respective opposite sides of the active wave guiding region 15. The barrier sections 41 extend parallel to the active wave guiding region 15 in the direction of light propagation. The effect of the barrier sections 41 in the wave guiding layer 2 on each side of the active wave guiding region 15 causes the carrier density profile across the active wave guiding region 15 to vary as each light pulse cycle progresses as illustrated in FIG. 2. This, thus, causes the effective refractive index profile and the photon density profile to similarly vary as each light pulse cycle progresses as illustrated in FIG. 2.

What is claimed is:

1. A semiconductor self-pulsating laser diode (1, 30, 40) comprising a wave guiding layer (2), characterised in that the laser diode (1, 30 configured so that when the laser diode is pumped,
   (a) an active wave guiding region (15) is defined in the wave guiding
   layer (2), the active wave guiding region (15) comprising a pulsed light generating region (17) in which pulsed light is guided during respective sequential light pulse cycles, the pulse light generating region (17) extending longitudinally in the direction of pulsed light propagation, and an adjacent light propagating region (18) in which light is propagated, and the refractive index of the light propagating region (18) is higher than the refractive index of the adjacent wave guiding layer (2), and
   (b) during each light pulse cycle the carrier density profile across the
   active wave guiding region (15) progressively varies such that initially the carrier density in the pulse light generating region (17) rises relative to the carrier density in the light propagating region (18) until the difference between the refractive index of the pulse light generating region (17) and the refractive index of the light propagating region (18) is at its greatest, and the carrier density of the pulse light generating region (17) reaches its lasing threshold value, thus causing lasing to commence in the active wave guiding region (15), and the lasing in the pulse light generating region (17) progressively reduces the carrier density therein, which in turn progressively reduces the relative difference between the refractive index of the pulse light generating region (17) and the light propagating region (18) until the refractive index of the pulse light generating region (17) approaches the refractive index of the light propagating region (18), thereby increasing guiding of the lasing light into the pulse light generation region (17) for emission of the light pulse therefrom, at which stage the carrier density of the active wave guiding region (15) falls below its lasing threshold value extinguishing the lasing light, and the next light pulse cycle commences.

2. A laser diode as claimed in claim 1 characterised in that the amount by which the refractive index of the pulse light generating region (17) is less than the refractive index of the light propagating region (18) at the beginning of each light pulse cycle is substantially similar to the amount by which the refractive index of the light propagating region (18) is higher than the refractive index of the adjacent wave guiding layer (2).

3. A laser diode as claimed in claim 1 characterised in that the transition of the refractive indices between the higher refractive index of the light propagating region (18) and the lower refractive index of the wave guiding layer (2) during pumping of the laser diode (1) is substantially a step transition.

4. A laser diode as claimed in claim 1 characterised in that the laser diode (1) is configured so that the progressive reduction in the carrier density of the pulse light generating region (17) after lasing commences in the active wave guiding region (15) is further facilitated by photopumping and charge carrier diffusion from the pulse light generating region (17) to the light propagating region (18).

5. A laser diode as claimed in claim 1 characterised in that the light propagating region (18) is located in the wave guiding layer (2) on respective opposite sides of the pulse light generating region (17), and extends parallel to the pulse light generating region (17).

6. A laser diode as claimed in claim 1 characterised in that the laser diode is configured by providing a current blocking layer (8) in the laser diode, the current blocking layer (8) defining a current passageway (10) for the passage of a pumping current therethrough and defining the active wave guiding region (15) in the wave guiding layer.

7. A laser diode as claimed in claim 6 characterised in that a pair of parallel spaced apart barrier means (41) are located in the wave guiding layer (2) extending parallel to the direction of light propagation in the pulse light generating region (17), the barrier means (41) defining the active wave guiding region (15) therebetween in a lateral direction perpendicular to the direction of light propagation in the pulse light generating region (17).

8. A laser diode as claimed in claim 6 characterised in that the wave guiding layer (2) is sandwiched between a pair of cladding layers (4,5), and the laser diode is configured by the provision of a pair of parallel spaced apart channels (31) located in one of the cladding layers (4) adjacent the pulse light generating region (17), the respective channels (31) extending parallel to the direction of light propagation in the pulse light generating region (17), and containing material of refractive index higher than the material of the cladding layer (4) for defining the active wave guiding region (15).

9. A laser diode as claimed in claim 1 characterised in that the material of the wave guiding layer (2) is selected for outputting light pulses of wavelength up to 1,700 nm.

10. A method for causing a laser diode (1,30,40) to output a plurality of light pulses in respective sequential light pulse cycles, the laser diode (1,30,40) comprising a wave guiding layer (2), and the method comprising the steps of configuring the laser diode (1,30,40) so that when the laser diode is pumped,
    (a) an active wave guiding region (15) is defined in the wave guiding
    layer (2), the active wave guiding region (15) comprising a pulsed light generating region (17) in which pulsed light is guided during respective sequential light pulse cycles, the pulse light generating region (17) extending longitudinally in the direction of pulsed light propagation, and an adjacent light propagating region (18) in which light is propagated, and the refractive index of the light propagating region (18) is higher than the refractive index of the adjacent wave guiding layer (2), and
    (b) during each light pulse cycle the carrier density profile across the
    active wave guiding region (15) progressively varies such that initially the carrier density in the pulse light generating region (17) rises relative to the carrier density in the light propagating region (18) until the difference between the refractive index of the pulse light generating region (17) and the refractive index of the light propagating region (18) is at its greatest, and the carrier density of the pulse light generating region (17) reaches its lasing threshold value, thus causing lasing to commence in the active wave guiding region (15), and the lasing in the pulse light generating region (17) progressively reduces the carrier density therein, which in turn progressively reduces the relative difference between the refractive index of the pulse light generating region (17) and the light propagating region (18) until the refractive index of the pulse light generating region (17) approaches the refractive index of the light propagating region (18), thereby increasing guiding of the lasing light into the pulse light generation region (17) for emission of the light pulse therefrom, at which stage the carrier density of the active wave guiding region (15) falls below its lasing threshold value extinguishing the lasing light, and the next light pulse cycle commences.

11. A method as claimed in claim 10 characterised in that the amount by which the refractive index of the pulse light generating region (17) is less than the refractive index of the light propagating region (18) at the beginning of each light pulse cycle is substantially similar to the amount by which the refractive index of the light propagating region (18) is higher than the refractive index of the adjacent wave guiding layer (2).

12. A method as claimed in claim 10 characterised in that the transition of the refractive indices between the higher refractive index of the light propagating region (18) and the lower refractive index of the active wave guiding layer (2) during pumping of the laser diode (1) is substantially a step transition.

13. A method as claimed in claim 10 characterised in that the laser diode is configured so that the progressive reduction in the carrier density of the pulse light generating region (17) after lasing commences in the active wave guiding region (15) is further facilitated by photopumping and charge carrier diffusion from the pulse light generating region to the light propagating region.

14. A method as claimed in claim 10 characterised in that the light propagating region (18) is located in the wave guiding layer (2) on respective opposite sides of the pulse light generating region (17), and extends parallel to the pulse light generating region (17).

15. A method as claimed in claim 10 characterised in that the laser diode is configured by providing a current blocking layer (8) in the laser diode, the current blocking layer (8) defining a current passageway (10) for the passage of a pumping current therethrough and defining the active wave guiding region (15) in the wave guiding layer (2).

16. A method as claimed in claim 15 characterised in that a pair of parallel spaced apart barrier means (41) are located in the wave guiding layer (2) extending parallel to the direction of light propagation in the pulse light generating region (17), the barrier means (41) defining the active wave guiding region (15) therebetween in a lateral direction perpendicular to the direction of light propagation in the pulse light generating region (17).

17. A method as claimed in claim 15 characterised in that the wave guiding layer (2) is sandwiched between a pair of cladding layers (4, 5), and the laser diode is configured by the provision of a pair of parallel spaced apart channels (31) located in one of the cladding layers (4) adjacent the pulse light generating region (17), the respective channels (31) extending parallel to the direction of light propagation in the pulse light generating region (17), and containing material of refractive index higher than the material of the cladding layer (4) for defining the active wave guiding region (15).

18. A method as claimed in claim 10 characterised in that the material of the wave guiding layer (2) is selected for outputting light pulses of wavelength up to 1,700 nm.

19. A laser diode as claimed in claim 1 characterised in that the material of the wave guiding layer (2) is selected for outputting light pulses of wavelength up to 650 nm.

20. A method as claimed in claim 10 characterised in that the material of the wave guiding layer (2) is selected for outputting light pulses of wavelength up to 650 nm.

* * * * *